(12) United States Patent
Liu

(10) Patent No.: US 10,650,755 B2
(45) Date of Patent: May 12, 2020

(54) PIXEL COMPENSATION CIRCUIT, SCAN DRIVING CIRCUIT AND DISPLAY PANEL

(71) Applicant: SHENZHEN CHINA STAR OPTOELECTRONICS SEMICONDUCTOR DISPLAY TECHNOLOGY CO., LTD., Shenzhen, Guangdong (CN)

(72) Inventor: Guohui Liu, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 196 days.

(21) Appl. No.: 15/735,893

(22) PCT Filed: Nov. 23, 2017

(86) PCT No.: PCT/CN2017/112476
§ 371 (c)(1),
(2) Date: Dec. 12, 2017

(87) PCT Pub. No.: WO2019/061765
PCT Pub. Date: Apr. 4, 2019

(65) Prior Publication Data
US 2019/0385532 A1 Dec. 19, 2019

(30) Foreign Application Priority Data
Sep. 28, 2017 (CN) .......................... 2017 1 0905137

(51) Int. Cl.
*G09G 3/30* (2006.01)
*G09G 3/3258* (2016.01)
(Continued)

(52) U.S. Cl.
CPC ......... *G09G 3/3266* (2013.01); *G09G 3/3258* (2013.01); *G09G 3/3677* (2013.01); *G09G 2320/0233* (2013.01)

(58) Field of Classification Search
CPC .. G09G 3/10; G09G 3/30; G09G 3/32; G09G 3/36; G09G 3/12; G09G 3/3258;
(Continued)

(56) References Cited

U.S. PATENT DOCUMENTS

2014/0340290 A1* 11/2014 Ono ..................... G09G 3/3233
345/77
2015/0379956 A1* 12/2015 Nonaka ................ G09G 3/3233
315/172
(Continued)

FOREIGN PATENT DOCUMENTS

CN 103440840 A 12/2013
CN 106847179 A 6/2017
(Continued)

*Primary Examiner* — Chanh D Nguyen
*Assistant Examiner* — Nguyen H Truong
(74) *Attorney, Agent, or Firm* — Hemisphere Law, PLLC; Zhigang Ma

(57) ABSTRACT

The present disclosure provides a pixel compensation circuit, a scan driving circuit and a display panel. The compensation circuit includes a first switch, its control terminal connecting to the first scanning signal, its first terminal connecting to the reference voltage, its second terminal connecting to the second terminal of the driving switch; a second switch, its control terminal connecting to the second scanning signal, its first terminal connecting to the data voltage, and its second terminal connecting to the control terminal of the driving switch and the second terminal of the first switch; a third switch, its control terminal connecting to the second scanning signal, its first terminal connecting to the voltage terminal, and its second terminal connecting to the first terminal of the driving switch, so as to eliminate the
(Continued)

influence of the threshold voltage, improve panel display uniformity, brightness and luminous efficiency.

4 Claims, 2 Drawing Sheets

(51) Int. Cl.
*G09G 3/3266* (2016.01)
*G09G 3/36* (2006.01)

(58) Field of Classification Search
CPC .. G09G 3/3291; G09G 3/3266; G09G 3/3283; G09G 3/3275; G09G 5/10
See application file for complete search history.

(56) References Cited

U.S. PATENT DOCUMENTS

| | | |
|---|---|---|
| 2016/0293105 A1 | 10/2016 | Wang et al. |
| 2017/0116918 A1 | 4/2017 | Dong et al. |
| 2017/0140707 A1 | 5/2017 | Xu et al. |
| 2018/0218676 A1* | 8/2018 | He ....................... G09G 3/3233 |

FOREIGN PATENT DOCUMENTS

| | | |
|---|---|---|
| CN | 107195274 A | 9/2017 |
| KR | 20150064545 A | 6/2015 |

* cited by examiner

_US 10,650,755 B2_

PIXEL COMPENSATION CIRCUIT, SCAN DRIVING CIRCUIT AND DISPLAY PANEL

RELATED APPLICATIONS

The present application is a National Phase of International Application Number PCT/CN2017/112476, filed Nov. 23, 2017, and claims the priority of China Application No. 201710905137.5, filed Sep. 28, 2017.

FIELD OF THE DISCLOSURE

The present disclosure relates to a display technology field, and more particularly to a pixel compensation circuit, a scan driving circuit and a display panel.

BACKGROUND OF THE DISCLOSURE

There are many unstable factors in the panel production process, which causes the threshold voltages of the driving thin film transistors of each pixel in the panel to be different. In addition, due to the prolonged working time of the thin film transistor, the thin film transistor material will be aged, causing the threshold voltage of the driving thin film transistor to drift. Moreover, the degree of aging of the thin film transistor materials in the panel is different, so that the threshold voltage drift values of the driving thin film transistors in the panel are different, thereby causing the panel to display uneven color at the same pixel voltage. And the turn-on voltage will also rise, which will result in reduced panel brightness, luminous efficiency decline.

SUMMARY OF THE DISCLOSURE

The technical problem to be solved by the present disclosure is to provide a pixel compensation circuit, a scan driving circuit and a display panel, so as to eliminate the influence of the threshold voltage, thereby improving panel display uniformity, panel brightness and luminous efficiency.

In order to solve the above technical problem, one technical solution adopted by the present disclosure is to provide a pixel compensation circuit including:

a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;

a storage capacitor, the storage capacitor comprises a first terminal and a second terminal, the first terminal of the storage capacitor is connected to the second terminal of the first controllable switch;

an organic light emitting diode, the organic light emitting diode comprises an anode and a cathode, the anode of the organic light emitting diode is connected to the second terminal of the storage capacitor, the cathode of the organic light emitting diode is grounded;

a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;

a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;

a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode.

In order to solve the above technical problem, one technical solution adopted by the present disclosure is to provide a scan driving circuit including a pixel compensation circuit, the pixel compensation circuit includes:

a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;

a storage capacitor, the storage capacitor comprises a first terminal and a second terminal, the first terminal of the storage capacitor is connected to the second terminal of the first controllable switch;

an organic light emitting diode, the organic light emitting diode comprises an anode and a cathode, the anode of the organic light emitting diode is connected to the second terminal of the storage capacitor, the cathode of the organic light emitting diode is grounded;

a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;

a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;

a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode.

In order to solve the above technical problem, one technical solution adopted by the present disclosure is to provide a display panel including a pixel compensation circuit, the pixel compensation circuit includes:

a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;

a storage capacitor, the storage capacitor comprises a first terminal and a second terminal, the first terminal of the storage capacitor is connected to the second terminal of the first controllable switch;

an organic light emitting diode, the organic light emitting diode comprises an anode and a cathode, the anode of the organic light emitting diode is connected to the second terminal of the storage capacitor, the cathode of the organic light emitting diode is grounded;

a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;

a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;

a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode.

The beneficial effects of the present disclosure are: different from the prior art, the pixel compensation circuit, the scan driving circuit and the display panel of the present disclosure eliminates the influence of the threshold voltage on the organic light-emitting diode through the first to the third controllable switches, the driving switch, the storage capacitor and the parasitic capacitor, thereby improving panel display uniformity, brightness and luminous efficiency.

DETAILED DESCRIPTION OF PREFERRED EMBODIMENTS

Figure 1:
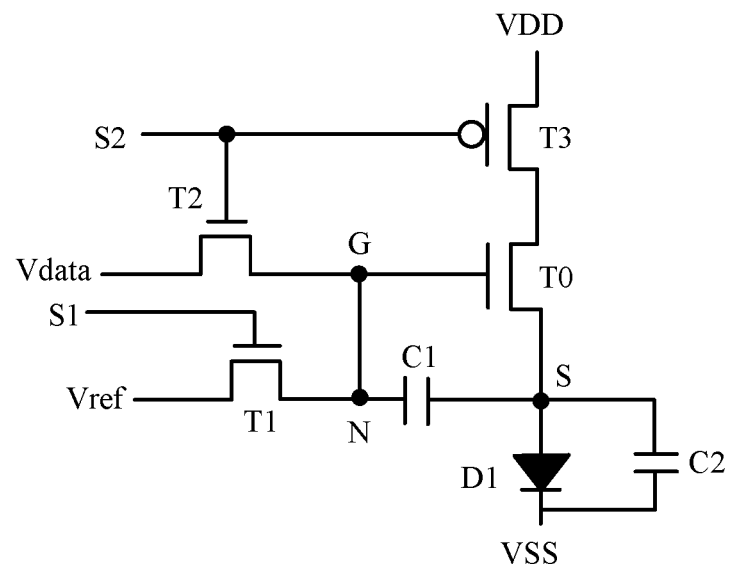
FIG. 1 is a circuit diagram of the pixel compensation circuit of the present disclosure.

Please refer to FIG. 1, FIG. 1 is a circuit diagram of the pixel compensation circuit of the present disclosure. The pixel compensation circuit includes a first controllable switch T1, the first controllable switch T1 comprises a control terminal, a first terminal and a second terminal, the control terminal of the first controllable switch T1 is connected to a first scanning line to receive a first scanning signal S1 from the first scanning line, the first terminal of the first controllable switch T1 is connected to a reference voltage terminal to receive a reference voltage Vref from the reference voltage terminal;

a storage capacitor C1, the storage capacitor C1 comprises a first terminal and a second terminal, the first terminal of the storage capacitor C1 is connected to the second terminal of the first controllable switch T1;

an organic light emitting diode D1, the organic light emitting diode D1 comprises an anode and a cathode, the anode of the organic light emitting diode D1 is connected to the second terminal of the storage capacitor C1, the cathode of the organic light emitting diode D1 is grounded;

a second controllable switch T2, the second controllable switch T2 comprises a control terminal, a first terminal and a second terminal, the control terminal of the second controllable switch T2 is connected to a second scanning line to receive a second scanning signal S2 from the second scanning line, the first terminal of the second controllable switch T2 is connected to a data voltage terminal to receive a data voltage Vdata from the data voltage terminal, the second terminal of the second controllable switch T2 is connected to the first terminal of the storage capacitor C1;

a driving switch T0, the driving switch T0 comprises a control terminal, a first terminal and a second terminal, the control terminal of the driving switch T0 is connected to the first terminal of the storage capacitor C1, the second terminal of the driving switch T0 is connected to the anode of the organic light emitting diode D1;

a third controllable switch T3, the third controllable switch T3 comprises a control terminal, a first terminal and a second terminal, the control terminal of the third controllable switch T3 is connected to the second scanning line, the first terminal of the third controllable switch T3 is connected to a voltage terminal VDD, the second terminal of the third controllable switch T3 is connected to the first terminal of the driving switch T0; and a parasitic capacitor C2, the parasitic capacitor C2 comprises a first terminal and a second terminal, the first terminal of the parasitic capacitor C2 is connected to the anode of the organic light emitting diode D1, the second terminal of the parasitic capacitor C2 is connected to the cathode of the organic light emitting diode D1.

In the present embodiment, the parasitic capacitor C2 is a parasitic capacitor of the organic light emitting diode D1, the parasitic capacitor C2 and the organic light emitting diode D1 are packaged together for dividing the voltage on the organic light emitting diode D1 to prevent the organic light emitting diode a1 from being damaged due to over voltage.

In the present embodiment, the driving switch T0, the first controllable switch T1 and the second controllable switch T2 are all NMOS thin film transistor, the control terminal, the first terminal and the second terminal of the driving switch T0, the first controllable switch T1 and the second controllable switch T2 are respectively correspond to a gate, a drain and a source of the NMOS thin film transistor; the third controllable switch T3 is a PMOS thin film transistor, the control terminal, the first terminal and the second terminal of the third controllable switch T3 are respectively correspond to a gate, a drain and a source of the PMOS thin film transistor. In other embodiments, the driving switch T0 and the first to third controllable switches T1-T3 may also be other types of switches, as long as the object of the present disclosure can be achieved.

Figure 2:
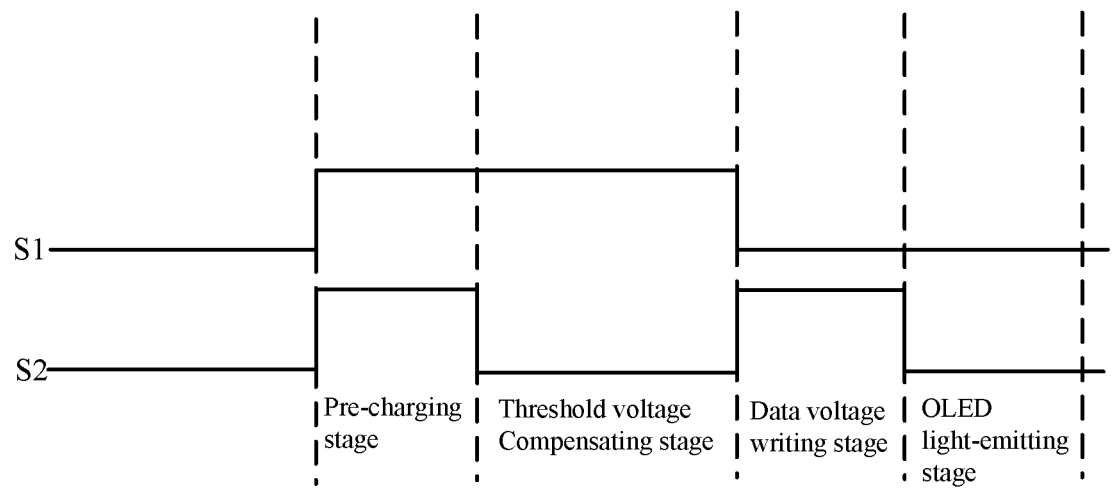
FIG. 2 is a waveform diagram of the pixel compensation circuit of the present disclosure.

Please refer to FIG. 1 and FIG. 2, the working principle of the pixel compensation circuit is described as follows:

Pre-charging stage: both the first scanning signal S1 and the second scanning signal S2 are at a high level, and at this time, the first controllable switch T1 is turned on. The reference voltage terminal outputs the reference voltage Vref to charge the node N to Vn=Vref. Since the potential at point G is the same as the potential at point N, that is, Vg=Vn, the control terminal voltage of the driving switch T0 also reaches the reference voltage Vref. At this time, the driving switch T0 is turned on. Because the second scanning signal S2 is also at a high level, the third controllable switch T3 is turned off, and no data voltage Vdata is output from the data voltage terminal. Therefore, the organic light emitting diode D1 does not emit light.

Threshold voltage compensating stage: The first scanning signal S1 is at a high level, and the second scanning signal S2 is at a low level. At this time, the second controllable switch T2 is turned off. The first controllable switch T1 and the third controllable switch T3 are both turned on. Since the N-point potential is equal to the G-point potential and equal to the reference voltage Vref, that is, Vn=Vg=Vref. So that the driving switch T0 is turned on, the voltage at the point S is pulled up by the voltage of the voltage terminal VDD, until the voltage difference between the control terminal (ie, the gate) and the second terminal (ie, the source) of the driving switch T0 is less than Vth, that is, Vg−Vs<Vth, the driving switch T0 is turned off. In this case, the storage capacitor C1 stores the threshold voltage Vth of the driving switch T0.

Data voltage writing stage: The second scanning signal S2 is at a high level, and the first scanning signal S1 is at a low level. At this moment, the data voltage terminal outputs the data voltage Vdata. The second controllable switch T2 and the driving switch T0 are both turned on. The first controllable switch T1 and the third controllable switch T3 are both turned off. The voltage Vg of the control terminal (ie the gate) of the driving switch T0 is equal to the data voltage Vdata, that is, Vg=Vdata. The potential difference ΔV1 is equal to the difference between the data voltage Vdata and the reference voltage Vref, that is, ΔV1=Vdata−Vref. The potential difference ΔV2=(Vdata−Vref)*(C1/(C1+C2)) of the point S is acquired from the charge sharing principle. At this time, the voltage at the S point Vs=(Vref−Vth) ΔV2= (Vref−Vth) (Vdata−Vref)*(C1/(C1+C2)).

Organic light emitting diode light-emitting stage: both the first scanning signal S1 and the second scanning signal S2 are at a low level. The first controllable switch T1 and the second controllable switch T2 are both turned off. The driving switch T0 and the third controllable switch T3 are both turned on. Since the N-point potential Vn is equal to Vdata, that is, Vn=Vdata. According to the transistor I-V curve equation I=½ K(Vgs−Vth)$^2$, wherein K is a constant, Vgs is a voltage between the gate and the source of the transistor. The current Ids of the organic light emitting diode D1 is obtained as follows: Ids=½ K(Vgs−Vth)$^2$=½ K[(1+a)(Vdata−Vref)]$^2$, a=C1/(C1+C2). It can be seen that the current through the organic light emitting diode D1 is independent of the threshold voltage Vth of the driving switch T0 and the influence of the threshold voltage Vth on the organic light emitting diode D1 is eliminated and the display uniformity, brightness and luminous efficiency are improved.

Figure 3:
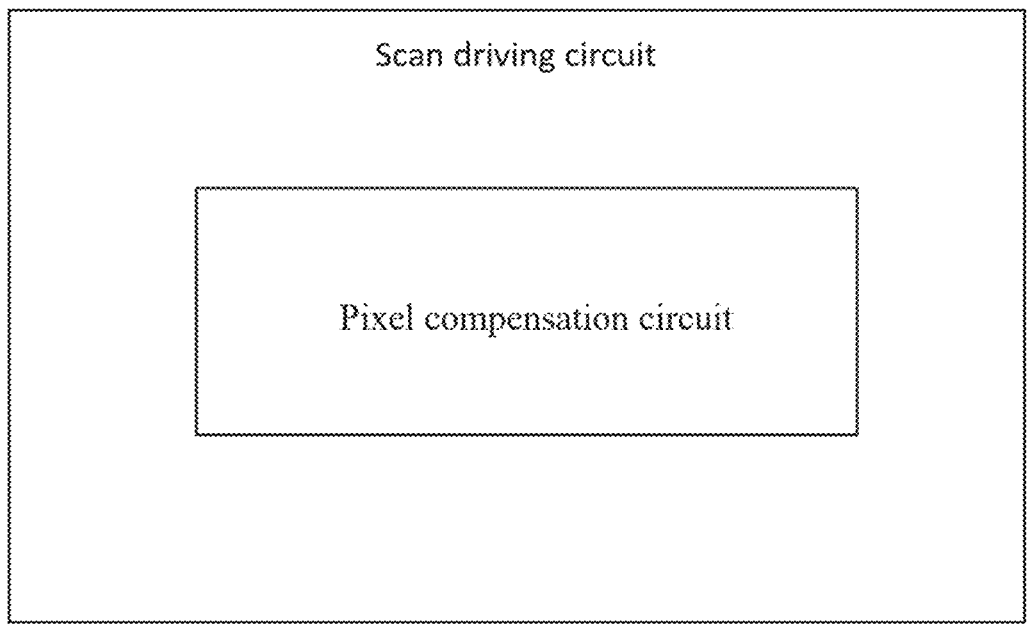
FIG. 3 is a schematic structural diagram of the scan driving circuit of the present disclosure.

Please refer to FIG. 3, FIG. 3 is a schematic structural diagram of the scan driving circuit of the present disclosure. The scan driving circuit includes the above-mentioned pixel compensation circuit. Other elements and functions of the scan driving circuit are the same as the elements and functions of the conventional scan driving circuit, and will not be further described herein.

Figure 4:
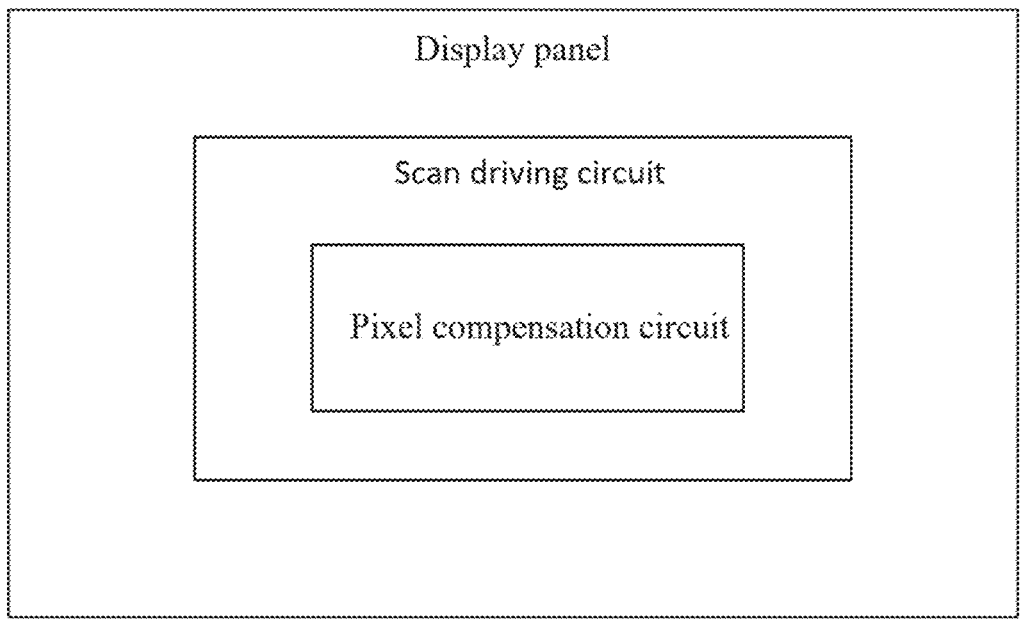
FIG. 4 is a schematic structural diagram of the display panel of the present disclosure.

Please refer to FIG. 4, FIG. 4 is a schematic structural diagram of the display panel of the present disclosure. The display panel includes the above-mentioned pixel compensation circuit. The display panel is an OLED or a LCD. Other devices and functions in the display panel are the same as the devices and functions of the existing display panel, and will not be further described herein.

the pixel compensation circuit, the scan driving circuit and the display panel eliminates the influence of the threshold voltage on the organic light-emitting diode through the first to the third controllable switches, the driving switch, the storage capacitor and the parasitic capacitor, thereby improving panel display uniformity, brightness and luminous efficiency.

The above are only the embodiments of the present disclosure, and are not intended to limit the scope of the present disclosure. All equivalent structures or equivalent changes made through the contents of the description and the drawings of the present disclosure or directly or indirectly applied to other related technical fields are similarly included in the protection scope of the present disclosure.

What is claimed is:

1. A pixel compensation circuit, wherein the pixel compensation circuit comprises:

a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;

a storage capacitor, the storage capacitor comprises a first terminal and a second terminal, the first terminal of the storage capacitor is connected to the second terminal of the first controllable switch;

an organic light emitting diode, the organic light emitting diode comprises an anode and a cathode, the anode of the organic light emitting diode is connected to the second terminal of the storage capacitor, the cathode of the organic light emitting diode is grounded;

a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;

a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;

a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode;

wherein the driving switch, the first controllable switch and the second controllable switch are all NMOS thin film transistor, the control terminal, the first terminal and the second terminal of the driving switch, the first controllable switch and the second controllable switch are respectively correspond to a gate, a drain and a source of the NMOS thin film transistor; the third controllable switch is a PMOS thin film transistor, the control terminal, the first terminal and the second terminal of the third controllable switch are respectively correspond to a gate, a drain and a source of the PMOS thin film transistor;

wherein in a pre-charging stage, both the first scanning signal and the second scanning signal are at a high level, and at this time, the first controllable switch is turned on, the third controllable switch is turned off;

in a threshold voltage compensating stage, the first scanning signal is at a high level, and the second scanning signal is at a low level, and at this time, the second controllable switch is turned off, the first controllable switch and the third controllable switch are both turned on;

in a data voltage writing stage, the second scanning signal is at a high level, and the first scanning signal is at a low level, and at this time, the second controllable switch is turned on, the first controllable switch and the third controllable switch are both turned off; and in an organic light emitting diode light-emitting stage, both the first scanning signal and the second scanning signal are at a low level, the first controllable switch and the second controllable switch are both turned off the third controllable switch is turned on.

2. A scan driving circuit, wherein the scan driving circuit comprises a pixel compensation circuit, the pixel compensation circuit comprises:

a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;

a storage capacitor, the storage capacitor comprises a first terminal and a second terminal, the first terminal of the storage capacitor is connected to the second terminal of the first controllable switch;

an organic light emitting diode, the organic light emitting diode comprises an anode and a cathode, the anode of the organic light emitting diode is connected to the second terminal of the storage capacitor, the cathode of the organic light emitting diode is grounded;

a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;

a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;

a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode;

wherein the driving switch, the first controllable switch and the second controllable switch are all NMOS thin film transistor, the control terminal, the first terminal and the second terminal of the driving switch, the first controllable switch and the second controllable switch are respectively correspond to a gate, a drain and a source of the NMOS thin film transistor; the third controllable switch is a PMOS thin film transistor, the control terminal, the first terminal and the second terminal of the third controllable switch are respectively correspond to a gate, a drain and a source of the PMOS thin film transistor;

wherein in a pre-charging stage, both the first scanning signal and the second scanning signal are at a high level, and at this time, the first controllable switch is turned on, the third controllable switch is turned off;

in a threshold voltage compensating stage, the first scanning signal is at a high level, and the second scanning signal is at a low level, and at this time, the second controllable switch is turned off, the first controllable switch and the third controllable switch are both turned on;

in a data voltage writing stage, the second scanning signal is at a high level, and the first scanning signal is at a low level, and at this time, the second controllable switch is turned on, the first controllable switch and the third controllable switch are both turned off, and in an organic light emitting diode light-emitting stage, both the first scanning signal and the second scanning signal are at a low level, the first controllable switch and the second controllable switch are both turned off the third controllable switch is turned on.

3. A display panel, wherein the display panel comprises a pixel compensation circuit, the pixel compensation circuit comprises:
- a first controllable switch, the first controllable switch comprises a control terminal, a first terminal and a second terminal, the control terminal of the first controllable switch is connected to a first scanning line to receive a first scanning signal from the first scanning line, the first terminal of the first controllable switch is connected to a reference voltage terminal to receive a reference voltage from the reference voltage terminal;
- a storage capacitor, the storage capacitor comprises a first terminal and a second terminal, the first terminal of the storage capacitor is connected to the second terminal of the first controllable switch;
- an organic light emitting diode, the organic light emitting diode comprises an anode and a cathode, the anode of the organic light emitting diode is connected to the second terminal of the storage capacitor, the cathode of the organic light emitting diode is grounded;
- a second controllable switch, the second controllable switch comprises a control terminal, a first terminal and a second terminal, the control terminal of the second controllable switch is connected to a second scanning line to receive a second scanning signal from the second scanning line, the first terminal of the second controllable switch is connected to a data voltage terminal to receive a data voltage from the data voltage terminal, the second terminal of the second controllable switch is connected to the first terminal of the storage capacitor;
- a driving switch, the driving switch comprises a control terminal, a first terminal and a second terminal, the control terminal of the driving switch is connected to the first terminal of the storage capacitor, the second terminal of the driving switch is connected to the anode of the organic light emitting diode;
- a third controllable switch, the third controllable switch comprises a control terminal, a first terminal and a second terminal, the control terminal of the third controllable switch is connected to the second scanning line, the first terminal of the third controllable switch is connected to a voltage terminal, the second terminal of the third controllable switch is connected to the first terminal of the driving switch; and
- a parasitic capacitor, the parasitic capacitor comprises a first terminal and a second terminal, the first terminal of the parasitic capacitor is connected to the anode of the organic light emitting diode, the second terminal of the parasitic capacitor is connected to the cathode of the organic light emitting diode;

wherein the driving switch, the first controllable switch and the second controllable switch are all NMOS thin film transistor, the control terminal, the first terminal and the second terminal of the driving switch, the first controllable switch and the second controllable switch are respectively correspond to a gate, a drain and a source of the NMOS thin film transistor; the third controllable switch is a PMOS thin film transistor, the control terminal, the first terminal and the second terminal of the third controllable switch are respectively correspond to a gate, a drain and a source of the PMOS thin film transistor;

wherein in a pre-charging stage, both the first scanning signal and the second scanning signal are at a high level, and at this time, the first controllable switch is turned on, the third controllable switch is turned off;

in a threshold voltage compensating stage, the first scanning signal is at a high level, and the second scanning signal is at a low level, and at this time, the second controllable switch is turned off, the first controllable switch and the third controllable switch are both turned on;

in a data voltage writing stage, the second scanning signal is at a high level, and the first scanning signal is at a low level, and at this time, the second controllable switch is turned on, the first controllable switch and the third controllable switch are both turned off; and in an organic light emitting diode light-emitting stage, both the first scanning signal and the second scanning signal are at a low level, the first controllable switch and the second controllable switch are both turned off the third controllable switch is turned on.

4. The display panel according to claim 3, wherein the display panel is OLED or LCD.

* * * * *